US010706915B2

(12) United States Patent
Pathak et al.

(10) Patent No.: US 10,706,915 B2
(45) Date of Patent: Jul. 7, 2020

(54) METHOD AND CIRCUIT FOR ADAPTIVE READ-WRITE OPERATION IN SELF-TIMED MEMORY

(71) Applicant: STMicroelectronics International N.V., Schiphol (NL)

(72) Inventors: Abhishek Pathak, Nowgong (IN); Tanmoy Roy, Greater Noida (IN); Shishir Kumar, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/351,773

(22) Filed: Mar. 13, 2019

(65) Prior Publication Data

US 2019/0279707 A1 Sep. 12, 2019

Related U.S. Application Data

(63) Continuation of application No. 15/917,227, filed on Mar. 9, 2018, now Pat. No. 10,283,191.

(51) Int. Cl.

| | |
|---|---|
| ***G11C 7/00*** | (2006.01) |
| ***G11C 11/412*** | (2006.01) |
| ***G11C 7/14*** | (2006.01) |
| ***G11C 11/419*** | (2006.01) |
| ***G11C 8/08*** | (2006.01) |
| ***G11C 11/413*** | (2006.01) |
| ***G11C 11/418*** | (2006.01) |

(52) U.S. Cl.

CPC .............. *G11C 11/412* (2013.01); *G11C 7/14* (2013.01); *G11C 8/08* (2013.01); *G11C 11/413* (2013.01); *G11C 11/418* (2013.01); *G11C 11/419* (2013.01)

(58) Field of Classification Search

CPC . G11C 11/412; G11C 11/4125; G11C 11/419; H01L 27/1104; H01L 27/11

USPC ........................................ 365/156, 194, 203

See application file for complete search history.

(56) References Cited

U.S. PATENT DOCUMENTS

| | | | | |
|---|---|---|---|---|
| 9,786,365 | B2 | 10/2017 | Zaitsu | |
| 2005/0180213 | A1 * | 8/2005 | Abe | G11C 11/5621 365/185.17 |
| 2008/0298142 | A1 | 12/2008 | Chen et al. | |

* cited by examiner

*Primary Examiner* — Son T Dinh

(74) *Attorney, Agent, or Firm* — Crowe & Dunlevy

(57) ABSTRACT

A memory device includes first and second dummy word line portions. A dummy word line driver drives the first dummy word line portion. A voltage dropping circuit causes a voltage on the second dummy word line to be less than a voltage on the first dummy word line. At least one dummy memory cell is coupled to the second dummy word line portion, remains in standby until assertion of the second dummy word line, and performs a dummy cycle in response to assertion of the second dummy word line. A reset signal generation circuit generates a reset signal in response to completion of a dummy cycle by the at least one dummy memory cell. An internal clock signal is generated from an external clock signal and the reset signal and is used in performing a read and/or write cycle to a memory array.

21 Claims, 5 Drawing Sheets

METHOD AND CIRCUIT FOR ADAPTIVE READ-WRITE OPERATION IN SELF-TIMED MEMORY

RELATED APPLICATION

This application is a continuation of U.S. application Ser. No. 15/917,227, filed Mar. 9, 2018, the contents of which are incorporated by reference in their entirety to the maximum extent under the law.

TECHNICAL FIELD

This disclosure is related to the field of static random access memory (SRAM), and in particular, to a dummy SRAM column for improving the read or write cycle time of an SRAM array by tracking the gate voltage of the pass gates of the SRAM cells of the SRAM array, effectuated by underdriving of the gate voltage of the pass gates of the dummy SRAM cells of the dummy SRAM column.

BACKGROUND

Semiconductor memory is a resource in modern computers used for data storage and program execution. Current trends in memory technology are toward greater density (more memory locations, or "cells," per memory device), higher speed, and improved efficiency.

There are various types of semiconductor memory, including volatile memory and non-volatile memory. A commonly used type of volatile memory is known as static random access memory, or "SRAM". SRAMs are widely used in applications where speed is of primary importance, such as the cache memory typically placed proximate to the processor or Central Processing Unit (CPU) in a personal computer or system on a chip.

A typical SRAM cell 50, comprised of six MOSFETS M51-M56, is now described with reference to FIG. 1. Multiple such SRAM cells 50 are used to form a SRAM array. Transistors M51-M52 form a first inverter 52, and transistors M53-M54 form a second inverter 54. The inverters 52 and 54 are cross-coupled. A bit of data is stored on the transistors M51-M54 forming the inverters 52 and 54. Transistors M55 and M56 act as pass gates controlling access to the SRAM cell 50 during read and write operations. Access to the SRAM cell 50 is enabled by the word line WL which controls the two pass gate transistors M55 and M56 which, in turn, control whether the SRAM cell 50 is connected to the bit lines BL and BLB. Bit lines BL and BLB are used to transfer data for both read and write operations. During read operations, the bit lines BL and BLB are actively driven high and low by the inverters 52 and 54, permitting readout by a sense amplifier (not shown). Prior to each access, the bit lines BL and BLB are pre-charged to a prescribed logic level.

The entire time interval required to complete a read or write operation to the SRAM cell 50 is termed the read cycle time or write cycle time. The read operation, and thus the read cycle time, has two components: a read access interval and a read pre-charge interval. During the read access interval, the logic state of the SRAM cell 50 is acquired by the associated sense amplifier. During the pre-charge interval, the bit lines BL and BLB are pre-charged to prepare for the next read operation. A read operation, and thus the read cycle time, can be considered to include a read access interval and then a read pre-charge interval, or a read pre-charge interval and then a read access interval.

A write operation, and thus the write cycle time, similarly includes a write access interval (during which the input data is transferred into the SRAM cell 50), and a write pre-charge interval. A write operation, and thus the write cycle time, can be considered to include a write access interval and then a write pre-charge interval, or a write pre-charge interval and then a write access interval.

For most SRAM cells 50, the read and write cycle times are not equal. The read access interval is typically longer than the write access interval, while the write pre-charge interval is generally longer than the read pre-charge interval.

The speed and efficiency of the SRAM cell 50 may be critically affected by these timings. For example, the read and write pre-charge intervals may be an appreciable portion of the read and write cycle times, and sense amplifier usage may contribute significantly to the overall power consumption of the SRAM cell 50. In early SRAM cell 50 designs, read and write cycle times were based on an externally generated clock signal. For example, if the SRAM cell 50 were used in a SRAM array used by a microcomputer, the bus clock in the memory interface would determine the read and write cycle times of the SRAM cells 50.

Though conceptually simple, reliance on the bus clock results in excessive power consumption. To overcome this inefficiency, manufacturers of SRAM arrays incorporated "self-time" circuitry into the SRAM arrays, to control timing independently of the externally generated clock signal. The self-time circuitry establishes the read and write access intervals, together with the subsequent read and write pre-charge intervals.

The self-time circuitry establishes the write cycle time by performing a dummy write operation on dummy SRAM cells of a dummy SRAM array. It is critical to ensure that the write cycle time is sufficient such that every SRAM cell in the SRAM array is writeable in the write cycle time determined by the self-time circuitry. Due to the very large number of SRAM cells 50 in a given SRAM array, a high sigma in statistical variation in operation of the transistors forming the SRAM cells 50 of the SRAM array must be accounted for.

A known dummy SRAM array 20 is shown in FIG. 2. Here, in addition to a first dummy SRAM cell 10 (a replica of that described above as SRAM cell 50), there is a second dummy SRAM cell 25 of the same configuration.

In the second dummy SRAM cell 25, transistors M7-M8 form a first inverter 16, and transistors M9-M10 form a second inverter 18. The inverters 16 and 18 are cross-coupled. Transistors M11 and M12 act as pass gates controlling access to the dummy SRAM cell 25 during its write operation, which proceed as described above. In addition, here it can be observed that transistors M15, M16 drive the dummy word line DWL.

This dummy SRAM array 20 performs a dummy write operation to determine the write cycle time for the SRAM array. The dummy write operation tracks the write cycle time of the SRAM cells 50 of the SRAM array to ensure that even the slowest SRAM cell is writeable in the determined write cycle time.

Three techniques to accomplish this tracking are used together in the dummy SRAM array 20. One is to simply increase the length of the dummy word line DWL path, which introduces additional resistance and capacitance into the dummy word line DWL path, represented by the resistor R, and the capacitors C1, C2. The values of the resistor R and the capacitors C1, C2 can be chosen through pie modeling of the resistance and capacitance of different devices and metals. The next technique is to vary the write driver 21 (formed from transistors M13, M14) size to vary how quickly the dummy bit lines DBL and DBLB fall, and/or to use inverters (e.g., INV1, INV2) to introduce delay to actuation of the write driver 21. The remaining technique is to vary the size of the capacitor C3 on the dummy complementary bitline DBLB. When the dummy write cycle is complete, the dummy SRAM array 20 asserts the reset signal output by inverter INV3. The reset signal is used in generating an internal clock utilized by both the dummy SRAM cells 10, 25 as well as the SRAM cells 50, which in turn is used to set read and write cycle times.

These techniques, either alone or in conjunction with each other, serve to introduce delay into the write cycle time to ensure that even the slowest SRAM cell 50 of the SRAM array is writeable in the write cycle time.

While the dummy SRAM array 20 accomplishes its goal, it results in a performance penalty to SRAM array 20. This penalty results from the fact that the dummy SRAM array 20 introduces delay suitable for the worst possible variation in PVT (process, voltage, temperature). Thus, the delay introduced may actually be in excess of what is actually required under current PVT conditions. Therefore, there is a need for better tracking of the PVT of the SRAM array 20 such that a more optimal read cycle time or write cycle time can be determined.

SUMMARY

Disclosed herein are dummy memory circuits for determining read and write cycle times of SRAM arrays.

A first embodiment is directed to a memory circuit including a dummy word line driver driving a dummy word line, a transmission gate coupled to the dummy word line, and a plurality of dummy memory cells. Each dummy memory cell includes a pair of cross coupled inverters and a pair of pass gates respectively coupled to the pair of cross coupled inverters, with the pair of pass gates controlled by the dummy word line and functioning to selectively couple the pair of cross coupled inverters to a dummy bit line and a dummy complementary bit line. A transistor is coupled to the dummy word line between the transmission gate and the pair of pass gates of a given one of the plurality of dummy memory cells closest to the transmission gate along the dummy word line. A reset signal output is coupled to the dummy complementary bit line. The transistor serves to lower a voltage on the dummy word line, and a reset signal indicating an end of a measured dummy cycle is generated at the reset signal output.

It is noted that the measured dummy cycle may be a dummy write cycle.

The memory circuit may include an array of memory cells, and an internal clock signal generator receiving an external clock signal and the reset signal. The internal clock generator may generate an internal clock signal based on the external clock signal and reset signal. The memory circuit may also include a write driver clocked by the internal clock signal and configured to write data to the array of memory cells. Each memory cell of the array of memory cells may include a pair of cross coupled inverters, and a pair of pass gates respectively coupled to the pair of cross coupled inverters, with the pair of pass gates controlled by a word line and functioning to selectively couple the pair of cross coupled inverters to a bit line and a complementary bit line. A word line driver may be powered between a supply voltage and ground, and may be configured to drive the word line. A dummy word line driver may be powered between the supply voltage and the ground, with the dummy word line driver configured to drive the dummy word line. The transmission gate may serve to decouple voltage drop on the dummy word line caused by the transistor from the word line.

The internal clock signal generator may generate the internal clock signal as a series of pulses, with each pulse of the series of pulses having a rising edge coinciding with an edge of the external clock signal and a falling edge coinciding with assertion of the reset signal.

A second embodiment is directed to a memory circuit with a dummy memory cell. The dummy memory cell includes: a first PMOS having its source coupled to a supply voltage, its drain coupled to a first node, and its gate coupled to a second node; a first NMOS having its drain coupled to the first node, its source coupled to ground, and its gate coupled to the second node; a second PMOS having its source coupled to the supply voltage, its drain coupled to a third node, and its gate coupled to a fourth node; and a second NMOS having its drain coupled to the third node, its source coupled to ground, and its gate coupled to the fourth node. The second node and third node are coupled. A first NMOS pass gate transistor has its source coupled to a dummy bit line, its drain coupled to the first node and fourth node, and its gate biased by a dummy word line. A second NMOS pass gate transistor has its source coupled to a dummy complementary bit line, its drain coupled to the third node and the second node, and its gate biased by the dummy word line. A word line driver is coupled to the dummy word line. A transmission gate is coupled to the dummy word line between the word line driver and the gate of the first NMOS pass gate transistor. A PMOS transistor has its source coupled to the dummy word line between the transmission gate and the gate of the first NMOS pass gate transistor. A reset output is coupled to the dummy complementary bit line.

The memory cell may also include an array of memory cells, an internal clock signal generator coupled to an external clock node and the reset output and having an internal clock output node, and a write driver having a clock input coupled to the internal clock output node of the internal clock signal generator and coupled to the array of memory cells.

A third embodiment is directed to a method of determining an operation time for an array of memory cells. This method includes performing a dummy operation to a column of dummy memory cells while underdriving gate voltages of pass gate transistors of the column of dummy memory cells, where completion of the dummy operation asserts a reset flag. The method also includes performing an operation on some of the array of memory cells in an operation time spanning from an edge of an external clock to assertion of the reset flag.

The operation time may be a write cycle time, and the dummy operation may be a dummy write operation. Alternatively, the operation time may be a read cycle time, and the dummy operation may be a dummy read operation.

A fourth embodiment is directed to a memory circuit having a dummy word line driver driving a dummy word line, a plurality of dummy memory cells coupled to a dummy bit line and a dummy complementary bit line, a transmission gate coupled to the dummy word line to pass a word line signal from the dummy word line driver to an input of the plurality of dummy memory cells, a transistor coupled to the dummy word line between the transmission gate and a pair of pass gates of a given one of the plurality of dummy memory cells closest to the transmission gate along the dummy word line, and a reset signal output coupled to the dummy complementary bit line. The transistor serves to lower a voltage on the dummy word line. A reset signal indicating an end of a measured dummy write cycle is generated at the reset signal output.

The memory circuit may also include an array of memory cells, and an internal clock signal generator receiving an external clock signal and the reset signal and generating an internal clock signal based thereupon. A write driver may be clocked by the internal clock signal and configured to write data to the array of memory cells. The internal clock signal generator may generate the internal clock signal as a series of pulses, with each pulse of the series of pulses having a rising edge coinciding with an edge of the external clock signal and a falling edge coinciding with assertion of the reset signal.

A fifth embodiment is directed to a memory device having a first dummy word line portion and a second dummy word line portion, a dummy word line driver driving the first dummy word line portion, a transmission gate selectively coupling the first dummy word line portion to the second dummy word line portion, at least one dummy memory cell coupled to the second dummy word line portion and a dummy bit line, a transistor coupled to the first dummy word line portion, and a reset signal output coupled to the dummy bit line. The transistor serves to lower a voltage on the second dummy word line portion, and a reset signal indicates an end of a measured dummy cycle is generated at the reset signal output.

The measured dummy cycle may be a measured dummy read cycle. In addition, the memory device may include a pre-charge device coupled to the dummy bit line and selectively switched by a signal on the second dummy word line portion. The pre-charge device may be turned on to charge the dummy bit line to a high logic state when the signal on the second dummy word line portion is deasserted, and turned off when the signal on the second dummy word line portion is asserted. The at least one dummy memory cell may include a pass gate coupled between the dummy bit line and a power supply node. The pass gate is switched on when the signal on the second dummy word line portion is asserted.

Also disclosed herein is a a memory device having a first dummy word line portion and a second dummy word line portion, with a dummy word line driver driving the first dummy word line portion. A voltage dropping circuit is coupled to the first and second dummy word line portions and is configured to cause a voltage on the second dummy word line portion to be less than a voltage on the first dummy word line portion. At least one dummy memory cell is coupled to the second dummy word line portion and is configured to remain in standby until assertion of the second dummy word line portion and to then perform a dummy cycle in response to assertion of the second dummy word line portion. A reset signal generation circuit is configured to generate a reset signal in response to completion of a dummy cycle by the at least one dummy memory cell.

The voltage dropping circuit may be a resistive divider.

The voltage dropping circuit may include a transmission gate coupled between the first and second dummy word line portions and a resistive divider coupled between the second dummy word line portion and ground.

A length of the first dummy word line portion is sufficient to introduce non-nominal resistance and capacitance to a conductive path formed by the first dummy word line portion.

The memory device may include an array of memory cells, and an internal clock signal generator receiving an external clock signal and the reset signal, and generating an internal clock signal based thereupon. A write driver may be clocked by the internal clock signal and configured to write data to the array of memory cells.

The at least one dummy memory cell may be a replica of at least one memory cell of the array of memory cells. The at least one dummy memory cell may include transistors having a same width to length ratio as transistors of the array of memory cells, but not having a same width and a same length as the transistors of the array of memory cells.

The dummy cycle may be a dummy write cycle.

The dummy cycle may be a dummy read cycle.

The at least one dummy memory cell may include a pass gate coupled between ground and a dummy bit line and configured to selectively couple the dummy bit line to ground in response to assertion of the second dummy word line portion, and a pre-charge circuit configured to pre-charge the dummy bit line in response to lack of assertion of the second dummy word line portion. The reset signal generation circuit may be coupled to the dummy bit line.

The reset signal generation circuit may include at least one inverter.

The at least one dummy memory cell may include first and second cross coupled inverters, with a first pass gate coupled between an output of the first inverter and a dummy bit line and configured to selectively couple the output of the first inverter to the dummy bit line in response to assertion of the second dummy word line portion, and a second pass gate coupled between an output of the second inverter and a dummy complementary bit line and configured to selectively couple the output of the second inverter to the dummy complementary bit line in response to assertion of the second dummy word line portion. The reset signal generation circuit may be coupled to the output of the second inverter.

The reset signal generation circuit may include at least one inverter.

A dummy write driver may be coupled to the dummy bit line.

A method disclosed herein includes performing a dummy operation to a column of dummy memory cells controlled by a second dummy word line portion. The performing of the dummy operation includes generating a first word line voltage on a first dummy word line portion, generating a second word line voltage on the second dummy word line portion, with the second word line voltage being less than the first word line voltage, and reading from or writing to the column of dummy memory cells, and asserting a flag when the read or write is completed.

The method may include generating an internal clock signal that has a first transition at an edge of an external clock and second transition at assertion of the flag, with the second transition being a next transition of the internal clock signal after the first transition. The method may also include performing a read cycle or write cycle on some of an array of memory cells that begins at the first transition of the internal clock signal and ends at the second transition of the internal clock signal.

The second word line voltage may be generated by coupling the first and second dummy word line portions together with a transmission gate, and by connecting a voltage divider between the second dummy word line portion and ground.

Connecting the voltage divider between the second dummy word line portion and ground may include biasing a transistor coupled between the second dummy word line portion and ground.

DETAILED DESCRIPTION

Figure 1:
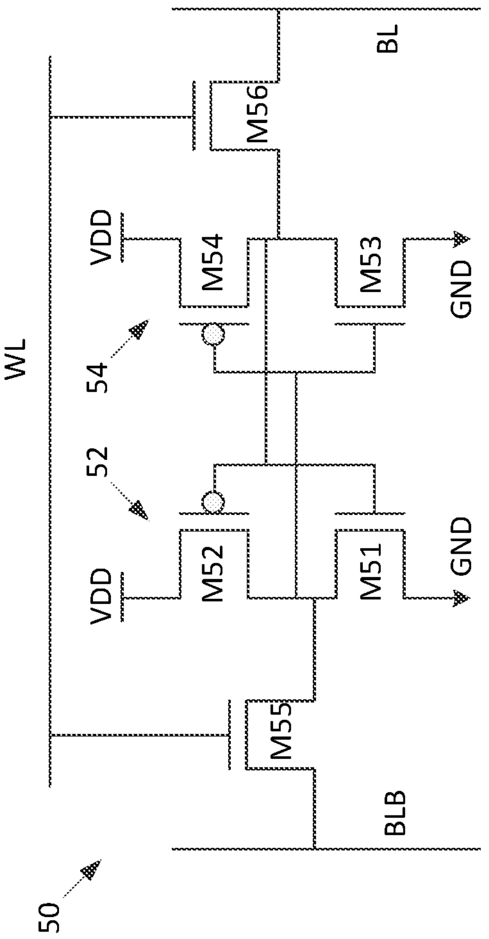
FIG. 1 is a schematic diagram of a known six transistor SRAM cell.
Figure 2:
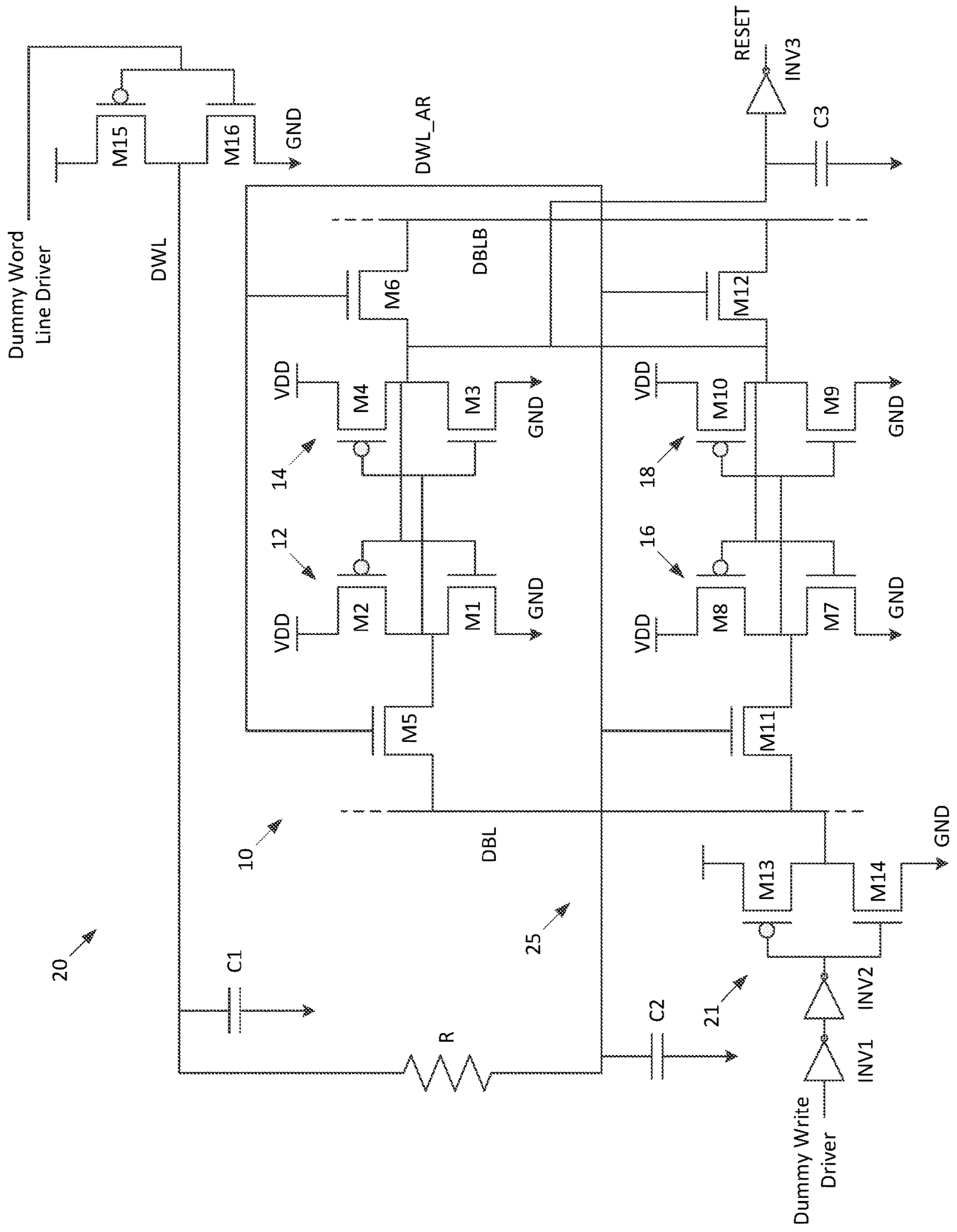
FIG. 2 is a schematic diagram of a known dummy SRAM array utilizing 6 transistor SRAM cells such as those of FIG. 1.

A SRAM device 100 in accordance with this disclosure will be described below. The SRAM device 100 includes a SRAM array 102 comprises of SRAM cells (e.g. SRAM cells 50 of FIG. 1) that are to be used for data storage. A dummy SRAM column 125 is also included within the SRAM device 100, and is used for generation of the reset signal, which is used in generation of an internal clock DecoderCLK. The internal clock DecoderCLK is ultimately used to time the read and write operations. Thus, the reset signal can be considered to be used to set the read and write cycle times.

Input/output circuitry 104 includes sense amplifiers/write drivers 132 for facilitating reads and writes of both SRAM array 102 and the dummy SRAM column 30.

Control circuitry 106 includes an internal clock generation circuit 124 that receives an external clock signal CLK and functions to generate the internal clock DecoderCLK, which is used in timing read and write operations (controlling read and write cycle times) of the SRAM array 102. The control circuitry 106 also includes a pre-decoder 122, which cooperates with the post-decoder 120 of decoder circuitry 108 to decode addresses for the SRAM array 102, which in turn is coupled to the word line WL.

Replica decoder circuitry 110 decodes addresses for dummy SRAM column 125, and is coupled to the dummy word line DWL. It is noted that the width of the SRAM array 102 is X, and that the dummy word line DWL extends from the replica decoder circuitry 110 to a halfway point X/2 of the width X of the SRAM array 102, then makes a U-shaped turn to return back to be coupled to the dummy column timer cells 126. This path and path length of the dummy word line DWL are used so as to simulate the entire length of the word line WL.

The internal clock generation circuit 124 generates the internal clock signal DecoderCLK as having a pulse rising at a suitable edge of the external CLK and falling when the reset signal is received from the dummy SRAM column 30.

Figure 4:
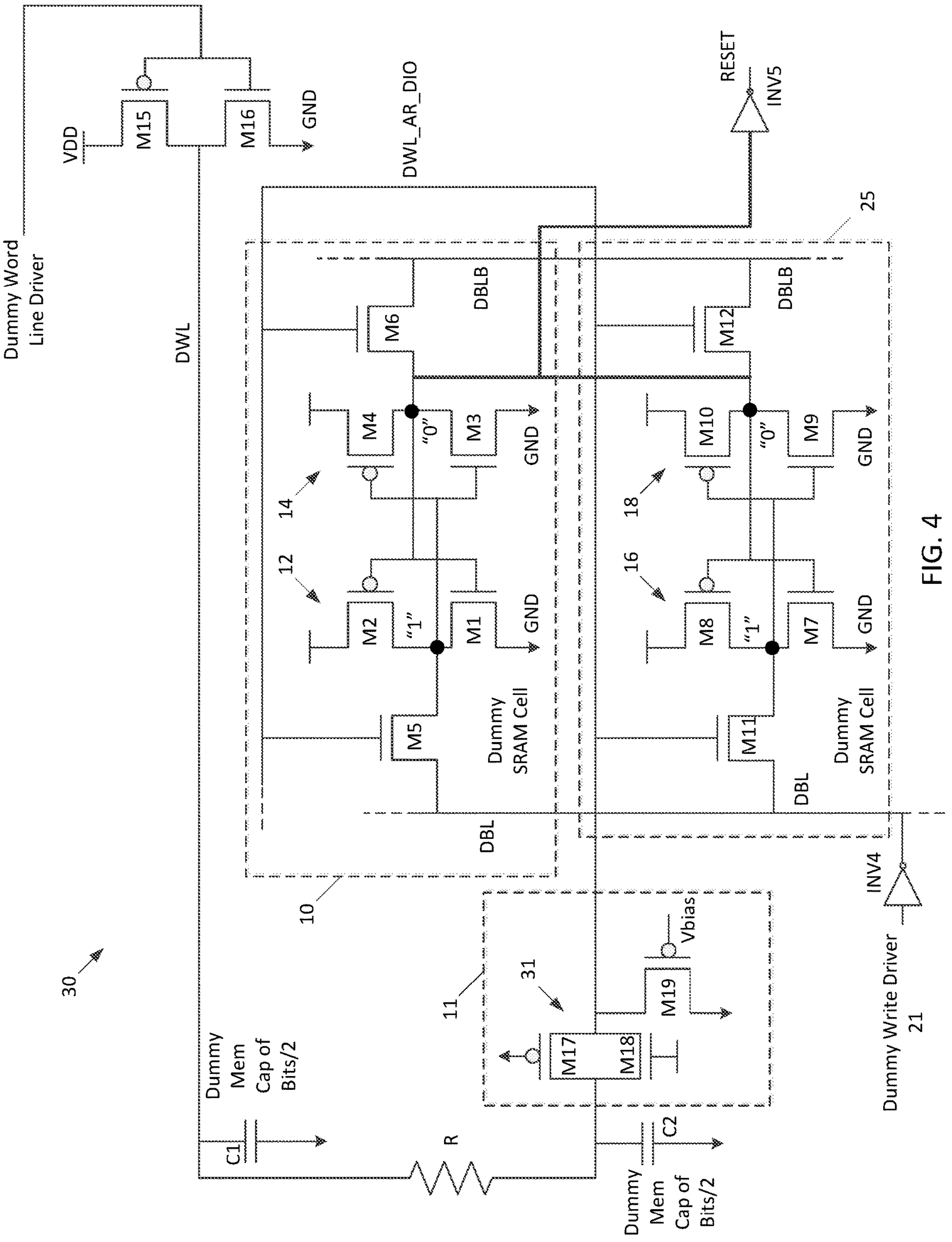
FIG. 4 is a schematic diagram of an SRAM device, in accordance with this disclosure, that utilizes circuitry to underdrive the gate voltage of the pass gate transistors of dummy SRAM cells of a dummy SRAM column to thereby generate a write cycle time that accurately tracks PVT induced variation of the SRAM cells of the SRAM array of the SRAM device.

With reference to FIG. 4, the dummy SRAM column 30 of this disclosure, used to generate the reset signal described above, is now described. Description of the function of the dummy SRAM column 30 will follow description of its structure.

The dummy SRAM column 30 illustratively includes two dummy SRAM cells 10 and 25, although it should be understood that these are but representative, and that any number of such dummy SRAM cells may be present. Dummy SRAM cells 10 and 25 may be replicas of the SRAM cells 50 (FIG. 1) of the SRAM array 102, formed as the same device types, of the same sizes, formed using the same processes. In some cases, the dummy SRAM cells 10 and 25 may be similar to the SRAM cells 50, but not full replicas. For example, the transistors of the dummy SRAM cells 10 and 25 may have the same width to length ratios as the corresponding transistors of the SRAM cells 50, but not the same dimensions. In other cases, some transistors of the dummy SRAM cells 10 and 25 may be replicas, or similar to, corresponding transistors of the SRAM cells 50, but not all transistors. In yet other cases, some transistors of the dummy SRAM cells 10 and 25 may be replicas of corresponding transistors of the SRAM cells 50, while other transistors of the dummy SRAM cells 10 and 25 are simply similar to corresponding transistors of the SRAM cells 50.

The dummy SRAM cell 10 is comprised of six MOSFETS M1-M6, with transistors M1-M2 forming a first inverter 12, and transistors M3-M4 forming a second inverter 14. The inverters 12 and 14 are cross-coupled. Transistors M5 and M6 act as pass gates controlling access to the dummy SRAM cell 10 during read and write operations. Access to the dummy SRAM cell 10 is enabled by the portion of the dummy word line, DWL_AR, which serves to controls the transistors M5 and M6.

The dummy SRAM cell 25 is comprised of six MOSFETS M7-M12, with transistors M7-M8 forming a first inverter 16, and transistors M9-M10 forming a second inverter 18. The inverters 18 and 18 are cross-coupled. Access to the dummy SRAM cell 25 is enabled by the portion of the dummy word DWL_AR that controls the transistors M11 and M12.

The length of the dummy word line path DWL and DWL_AR introduces resistance and capacitance, represented by resistor R and capacitors C1, C2. Inverter INV4 couples the dummy write driver 21 to the dummy bit line DBL. A transmission gate 31 is formed from transistors M17, M18, and serves as a resistive path between the dummy word line portions DWL and DWL_AR. This resistive path can also be realized through the use of any metal or material of a gate of any device (e.g., polysilicon).

Transistor M19 is biased by bias voltage Vbias, and sinks current from DWL to ground, effectively forming a resistive divider 11 when paired with the transmission gate 31 to thereby generate DWL_AR. Vbias is set to a reference voltage, such as ground, such that transistor M19 remains on.

In operation, during the write pre-charge interval of a dummy write operation, the dummy bitline DBL is precharged to a first logic value, while the complementary dummy bitline DBLB is pre-charged to a second logic value. Which of the dummy bitline DBL or dummy complementary bitline DBLB is driven to what logic value is dependent upon the data value to be written to the dummy SRAM cells 10 and 25. The dummy word line DWL is then activated, indicating the ending of the write pre-charge interval and beginning of the write access interval.

In the write access interval, when DWL_AR reaches a suitable overdrive voltage for the gates of transistors M11, M12, M5, and M6, those transistors turn on, resulting in the contents of the inverters 12, 14 of dummy SRAM cells 10, and the contents of the inverters 16, 18 of the dummy SRAM cells 25, being flipped. This flipping generates the reset signal at inverter INV5, indicating the end of the dummy write operation, and thus the end of the dummy write cycle time.

The resistive divider 11 serves to cause the dummy word line portion DWL_AR to have a lower voltage than the dummy word line portion DWL. Therefore, the overdrive voltage provided to the gates of the transistors M11, M12, M5, M6 (which act as pass gates) by DWL_AR is less than would be provided by DWL, thus it can be said that DWL_AR is underdriving the gate of transistors M11, M12, M5, M6. Consequently, due to the sinking of current from DWL by transistor M19 to produce DWL_AR, the gate voltages on the transistors M11, M12, M5, M6 of the dummy SRAM cells 10, 25 are set to an overdriven condition that is similar to, or substantially equal to, the overdriven condition of the gates of the transistors M55, M56 of the SRAM cells 50 of the SRAM array 102.

Figure 3:
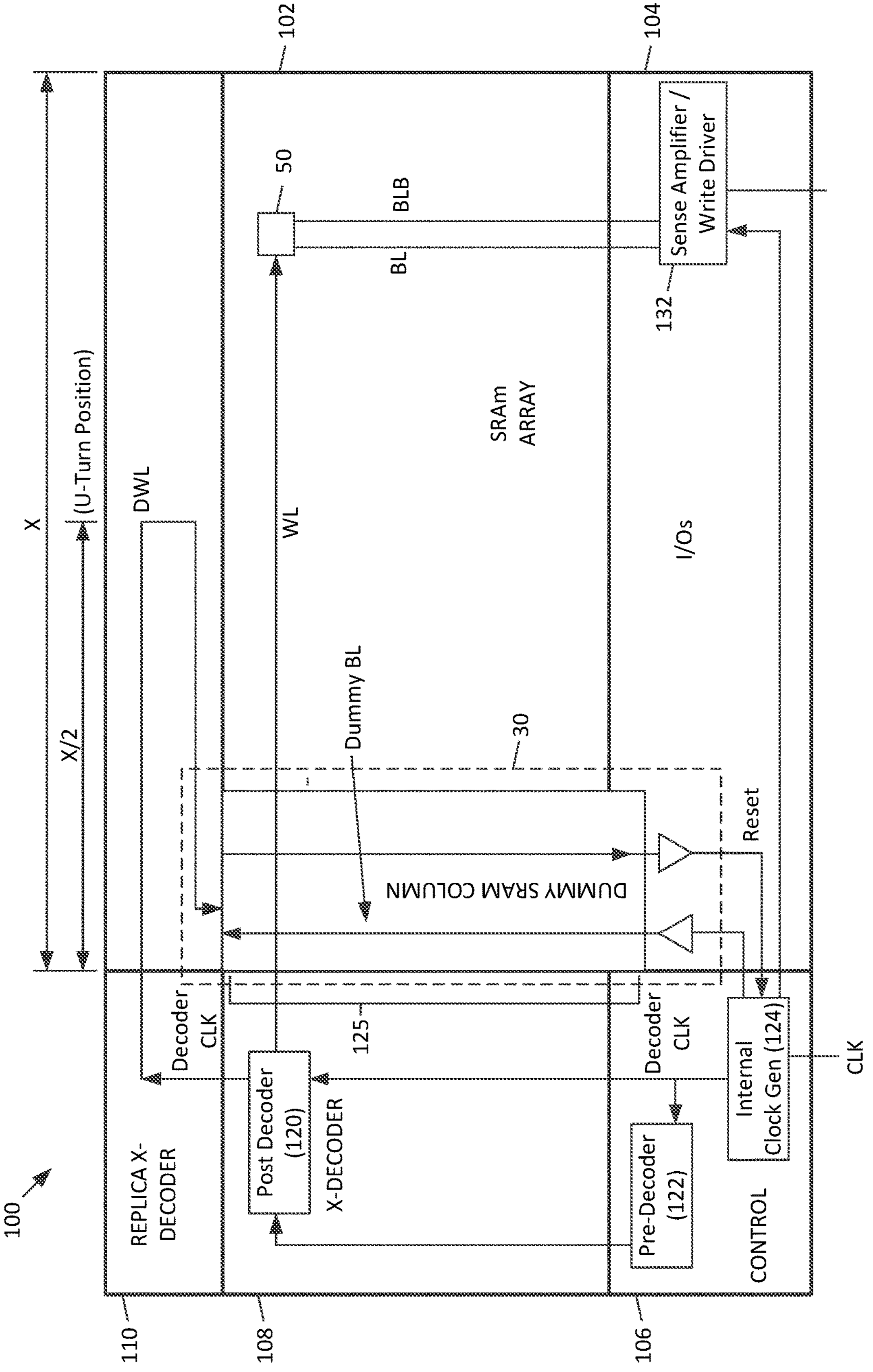
FIG. 3 is a block diagram showing a layout of a SRAM device including a dummy SRAM column.

Because transistors in the dummy SRAM column 30 match the transistors in the SRAM cells 50 of the SRAM array 102 within statistical limits, and because the worst off of the transistors M11, M12, M5, M6 in terms of PVT will see a reduced overdrive voltage at their gates as compared to others of the transistors M11, M12, M5, M6, the overdrive voltage of the gates of transistors M55 and M56 in the SRAM cells 50 (so, the transistors of the SRAM cells 50 that act as pass gates) is thereby tracked by DWL_AR to generate a proper write cycle time for use by the SRAM array 102 of FIG. 3.

The size ratio of the transistor M19 and the transmission gate 31 formed from transistors M17 and M18 defines the amount by which the voltage of DWL_AR is lower than DWL. Stated another way, this size ratio sets the overdrive voltage on the gates of the transistors M11, M12, M5, M6 of the dummy SRAM cells 10, 25. The overdrive voltage to be set by the size ratio is predetermined by calculating an estimated variation of the threshold voltage of a transistor M11, M12, M5, or M6 from its nominal value. This estimation is performed based upon a sigma qualification requirement for the SRAM array 102.

The dummy SRAM column 30 provides particularly accurate tracking of the overdrive voltage of transistors M55 and M56 of the SRAM cells 50 during the write operation to determine the write cycle time, although the dummy SRAM column 30 can also be used to determine a read cycle time as well.

A simulated dummy SRAM column 30' is now described with reference to FIG. 5, and is used for determining a read cycle time. It has been found that the transistors of a SRAM cell that act as pass gates are the most susceptible to PVT variation. Therefore, it is possible to eliminate the inverters from the dummy SRAM cells 10 and 25 of the dummy SRAM column 30, when forming the simulated dummy SRAM column 30'.

The dummy SRAM column 30' illustratively includes two simulated dummy SRAM cells 10' and 25', although it should be understood that these are but representative, and that any number of such simulated dummy SRAM cells may be present. Simulated dummy SRAM cell 10' includes transistor M5 coupled between VDD and the dummy bit line DBL, and biased by the dummy word line DWL. Likewise, simulated dummy SRAM cell 25' includes transistor M11 coupled between VDD and the dummy bit line DBL, and biased by the dummy word line DWL.

Transistors M5, M11 may be replicas of the transistors M55, M56 of the SRAM cells 50 (FIG. 1) of the SRAM array 102, formed as the same device types, of the same sizes, formed using the same processes.

In some cases, the transistors M5, M11 may be similar to the transistors M55, M56 of the SRAM cells 50 (FIG. 1), but not full replicas. For example, the transistors M5, M11 may have the same width to length ratios as the transistors M55, M56 of the SRAM cells 50 (FIG. 1), but not the same dimensions. In other cases, one of the transistors M5, M11 may be a replica of, or similar to, transistors M55, M56 of the SRAM cells 50 (FIG. 1), while the other of transistors M5, M11 is not a replica. In yet other cases, one of the transistors M5, M11 may be a replica of transistors M55, M56 of the SRAM cells 50 (FIG. 1), while the other of transistors M5, M11 is similar to the transistors M55, M56 of the SRAM cells 50 (FIG. 1), but is nota replica.

Figure 5:
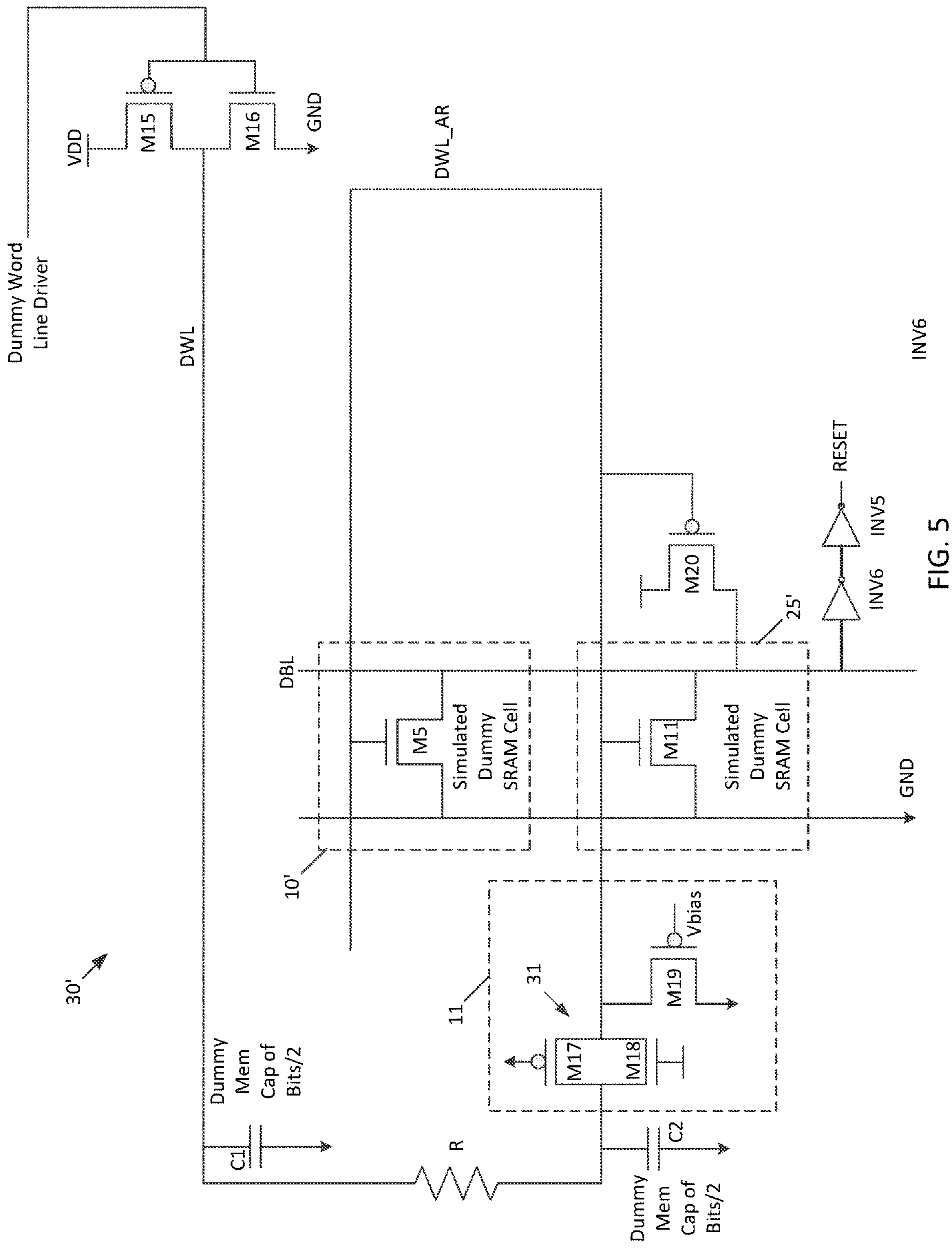
FIG. 5 is a schematic diagram of a simulated dummy SRAM column, in accordance with this disclosure, that generates a usable read or write cycle time that accurately tracks PVT induced variation of the read or write operation of the SRAM cells of the SRAM array of the SRAM device, based upon the variation in threshold voltage of pass gate transistors that would be used in dummy SRAM cells were there a dummy SRAM column instead of the simulated dummy SRAM column.

As with the dummy SRAM column 30 of FIG. 4, the length of the dummy word line path DWL and DWL_AR in the simulated dummy SRAM column 30' of FIG. 5 introduces resistance and capacitance, represented by capacitors C1, C2 and resistor R. Inverter INV4 couples the dummy write driver 21 to the dummy bit line DBL. A transmission gate 31 is formed from transistors M17, M18, and serves as a resistive path between the dummy word line portions DWL and DWL_AR. This resistive path can also be realized through the use of any metal or material of a gate of any device (e.g., polysilicon).

Transistor M19 is biased by transistor M15 and bias voltage Vbias, and sinks current from DWL to ground, effectively forming a resistive divider 11 when paired with the transmission gate 31 to thereby generate DWL_AR. Vbias is set to a reference voltage, such as ground, such that transistor M19 remains on.

In operation, during the read pre-charge interval of a simulated dummy read operation, dummy bitline DBL is pre-charged high by transistor M20, which pulls DBL high when DWL_AR is low. The dummy word line DWL is then activated, indicating the ending of the pre-charge interval and beginning of the read access interval.

In the read access interval, when DWL_AR reaches a suitable overdrive voltage for the gates of transistors M11, M5, those transistors turn on, and transistor M20 turns off, ultimately resulting in the discharge of DBL, which generates a reset signal at inverter INV5, indicating the end of the dummy read operation, and thus the end of the dummy read cycle time.

The resistive divider 11 serves to cause the dummy word line portion DWL_AR to have a lower voltage than the dummy word line portion DWL. Therefore, the overdrive voltage provided to the gates of the transistors M11, M5, (which act as pass gates) by DWL_AR, is less than would be provided by DWL. Consequently, due to the sinking of current from DWL by transistor M19 to produce DWL_AR, the gate voltages on the transistors M11, M5, of the simulated dummy SRAM cells 10', 25' are set to an overdriven condition that is similar to, or substantially equal to, the overdriven condition of the gates of the transistors M55, M56 of the SRAM cells 50 of the SRAM array 102.

Because transistors in the simulated dummy SRAM column 30' match the transistors M55, M56 in the SRAM cells 50 of the SRAM array 102 within statistical limits, and because the worst off of the transistors M11, M5 in terms of PVT will see a reduced overdrive voltage at their gates as compared to other, the overdrive voltage of the gates of transistors M55 and M56 in the SRAM cells 50 (so, the transistors of the SRAM cells 50 that act as pass gates) is tracked by DWL_AR to generate a proper read cycle time.

As with the embodiment of FIG. 4, the size ratio of the transistor M19, and the transmission gate 31 formed from transistors M17 and M18 sets the overdrive voltage on the gates of the transistors M11, M12, M5, M6 of the dummy SRAM cells 10, 25. The overdrive voltage to be set by the size ratio is predetermined by calculating an estimated variation of the threshold voltage of a transistor M11 or M5 from its nominal value. This estimation is performed based upon a sigma qualification requirement for the SRAM array 102.

The simulated dummy SRAM column can also be used to determine write cycle time for use by the SRAM array 102 of FIG. 3. During the write pre-charge interval, the dummy bit line DBL remains precharged to VDD through transistor M20. In the write access interval, as DWL_AR is asserted, transistor M20 is switched off, and transistors M5 and M11 are turned on. When on, transistors M5 and M11 discharge the dummy bit line DBL to ground, and in turn inverter INV5 generates the reset signal RESET signal when the dummy bit line DBL has discharged, indicating the end of the dummy write operation, and thus the end of the dummy write cycle time.

The simulated dummy SRAM column 30' provides accurate tracking of the overdrive voltage of transistors M55 and M56 of the SRAM cells 50 during the read and write operations to determine accurate read and write cycle times for use by the SRAM array 102 of FIG. 3 that eliminates unnecessary delay.

The invention claimed is:

1. A memory device, comprising:

a first dummy word line portion and a second dummy word line portion;

a dummy word line driver driving the first dummy word line portion;

a voltage dropping circuit coupled to the first and second dummy word line portions and configured to cause a voltage on the second dummy word line portion to be less than a voltage on the first dummy word line portion;

at least one dummy memory cell coupled to the second dummy word line portion and configured to remain in standby until assertion of the second dummy word line portion and to perform a dummy cycle in response to assertion of the second dummy word line portion; and a reset signal generation circuit configured to generate a reset signal in response to completion of a dummy cycle by the at least one dummy memory cell.

2. The memory device of claim 1, wherein the voltage dropping circuit comprises a resistive divider.

3. The memory device of claim 1, wherein the voltage dropping circuit comprises a transmission gate coupled between the first and second dummy word line portions and a resistive divider coupled between the second dummy word line portion and ground.

4. The memory device of claim 1, wherein a length of the first dummy word line portion is sufficient to introduce non-nominal resistance and capacitance to a conductive path formed by the first dummy word line portion.

5. The memory device of claim 1, further comprising:

an array of memory cells;

an internal clock signal generator receiving an external clock signal and the reset signal, and generating an internal clock signal based thereupon; and a write driver clocked by the internal clock signal and configured to write data to the array of memory cells.

6. The memory device of claim 5, wherein the at least one dummy memory cell is a replica of at least one memory cell of the array of memory cells.

7. The memory device of claim 5, wherein the at least one dummy memory cell is comprised of transistors having a same width to length ratio as transistors of the array of memory cells, but not having a same width and a same length as the transistors of the array of memory cells.

8. The memory device of claim 5, wherein the dummy cycle is a dummy write cycle.

9. The memory device of claim 1, wherein the dummy cycle is a dummy read cycle.

10. The memory device of claim 1, wherein the at least one dummy memory cell comprises:

a pass gate coupled between ground and a dummy bit line and configured to selectively couple the dummy bit line to ground in response to assertion of the second dummy word line portion; and a pre-charge circuit configured to pre-charge the dummy bit line in response to lack of assertion of the second dummy word line portion;

wherein the reset signal generation circuit is coupled to the dummy bit line.

11. The memory device of claim 10, wherein the reset signal generation circuit comprises at least one inverter.

12. The memory device of claim 1, wherein the at least one dummy memory cell comprises:

first and second cross coupled inverters;

a first pass gate coupled between an output of the first inverter and a dummy bit line and configured to selectively couple the output of the first inverter to the dummy bit line in response to assertion of the second dummy word line portion; and a second pass gate coupled between an output of the second inverter and a dummy complementary bit line and configured to selectively couple the output of the second inverter to the dummy complementary bit line in response to assertion of the second dummy word line portion;

wherein the reset signal generation circuit is coupled to the output of the second inverter.

13. The memory device of claim 12, wherein the reset signal generation circuit comprises at least one inverter.

14. The memory device of claim 12, further comprising a dummy write driver coupled to the dummy bit line.

15. A method, comprising:

performing a dummy operation to a column of dummy memory cells controlled by a second dummy word line portion, the performing of the dummy operation including:

generating a first word line voltage on a first dummy word line portion coupled to the second dummy word line portion by a voltage drop circuit;

generating a second word line voltage on the second dummy word line portion, with the second word line voltage being less than the first word line voltage due to current flow from the first dummy word line portion, across the voltage drop circuit, to the second dummy word line portion; and reading from or writing to the column of dummy memory cells, and asserting a flag when the read or write is completed.

16. The method of claim 15, further comprising generating an internal clock signal that has a first transition at an edge of an external clock and second transition at assertion of the flag, the second transition being a next transition of the internal clock signal after the first transition; and performing a read cycle or write cycle on some of an array of memory cells that begins at the first transition of the internal clock signal and ends at the second transition of the internal clock signal.

17. A method comprising:

performing a dummy operation to a column of dummy memory cells controlled by a second dummy word line portion, the performing of the dummy operation including:

generating a first word line voltage on a first dummy word line portion;

generating a second word line voltage on the second dummy word line portion, with the second word line voltage being less than the first word line voltage, wherein the second word line voltage is generated by coupling the first and second dummy word line portions together with a transmission gate, and connecting a voltage divider between the second dummy word line portion and ground; and reading from or writing to the column of dummy memory cells, and asserting a flag when the read or write is completed.

18. The method of claim 17, wherein connecting the voltage divider between the second dummy word line portion and ground comprises biasing a transistor coupled between the second dummy word line portion and ground.

19. The method of claim 17, further comprising generating an internal clock signal that has a first transition at an edge of an external clock and second transition at assertion of the flag, the second transition being a next transition of the internal clock signal after the first transition; and performing a read cycle or write cycle on some of an array of memory cells that begins at the first transition of the internal clock signal and ends at the second transition of the internal clock signal.

20. A method, comprising:

performing a dummy operation to a column of dummy memory cells controlled by a second dummy word line portion, the performing of the dummy operation including:

generating a first word line voltage on a first dummy word line portion;

generating a second word line voltage on the second dummy word line portion, with the second word line voltage being less than the first word line voltage; and reading from or writing to the column of dummy memory cells, and asserting a flag when the read or write is completed;

generating an internal clock signal that has a first transition at an edge of an external clock and second transition at assertion of the flag, the second transition being a next transition of the internal clock signal after the first transition; and performing a read cycle or write cycle on some of an array of memory cells that begins at the first transition of the internal clock signal and ends at the second transition of the internal clock signal.

21. The method of claim 20, further comprising generating an internal clock signal that has a first transition at an edge of an external clock and second transition at assertion of the flag, the second transition being a next transition of the internal clock signal after the first transition; and performing a read cycle or write cycle on some of an array of memory cells that begins at the first transition of the internal clock signal and ends at the second transition of the internal clock signal.

* * * * *